United States Patent
Tao et al.

(10) Patent No.: US 9,818,752 B2
(45) Date of Patent: Nov. 14, 2017

(54) MEMORY METAL SCHEME

(71) Applicant: TAIWAN SEMICONDUCTOR MANUFACTURING COMPANY, LTD., Hsinchu (TW)

(72) Inventors: Derek C. Tao, Hsinchu (TW); Jacklyn Chang, Hsinchu (TW); Kuoyuan (Peter) Hsu, Hsinchu (TW); Yukit Tang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 15/153,872

(22) Filed: May 13, 2016

(65) Prior Publication Data

US 2016/0254267 A1    Sep. 1, 2016

Related U.S. Application Data

(62) Division of application No. 14/600,666, filed on Jan. 20, 2015, now Pat. No. 9,368,443.

(51) Int. Cl.
| | |
|---|---|
| *G11C 5/02* | (2006.01) |
| *G11C 5/06* | (2006.01) |
| *H01L 27/11* | (2006.01) |
| *H01L 23/50* | (2006.01) |
| *G11C 11/418* | (2006.01) |
| *G11C 11/419* | (2006.01) |
| *H01L 23/522* | (2006.01) |
| *H01L 23/528* | (2006.01) |

(Continued)

(52) U.S. Cl.
CPC ............ *H01L 27/11* (2013.01); *G11C 11/418* (2013.01); *G11C 11/419* (2013.01); *H01L 23/50* (2013.01); *H01L 23/528* (2013.01); *H01L 23/5226* (2013.01); *H01L 27/0207* (2013.01); *H01L 27/1116* (2013.01); *G11C 5/02* (2013.01); *G11C 5/06* (2013.01); *G11C 2213/71* (2013.01); *H01L 27/0688* (2013.01); *H01L 2224/73265* (2013.01)

(58) Field of Classification Search
CPC ....... G11C 11/418; G11C 11/419; G11C 5/02; G11C 5/06; G11C 2213/71; H01L 27/11; H01L 23/50; H01L 23/5226; H01L 23/528; H01L 27/0207; H01L 27/1116; H01L 27/0688; H01L 2224/73265
USPC ..................................... 365/63, 51
See application file for complete search history.

(56) References Cited

U.S. PATENT DOCUMENTS

| | | | |
|---|---|---|---|
| 7,236,385 B2 * | 6/2007 | Thompson | ............. G11C 5/025 257/211 |
| 8,421,205 B2 | 4/2013 | Yang | |

(Continued)

*Primary Examiner* — Ly D Pham
(74) *Attorney, Agent, or Firm* — Hauptman Ham, LLP

(57) ABSTRACT

A method of fabricating a memory includes forming a first portion of a first line in a first metal layer, forming a first portion of a second line in the first metal layer, forming a second portion of the first line in a second metal layer, and forming a second portion of the second line in a third metal layer. The first line is over a plurality of memory cells. The second line is over the plurality of memory cells, the first line is electrically isolated from the second line, and the first line and the second line extend in a same direction. The second metal layer is over the first metal layer. The third metal layer is over the second metal layer and the third metal layer is electrically isolated from the first line.

20 Claims, 8 Drawing Sheets

(51) Int. Cl.
  *H01L 27/02*    (2006.01)
  *H01L 27/06*    (2006.01)

(56) References Cited

U.S. PATENT DOCUMENTS

| | | |
|---|---|---|
| 8,661,389 B2 | 2/2014 | Chern et al. |
| 8,698,205 B2 | 4/2014 | Tzeng et al. |
| 8,826,212 B2 | 9/2014 | Yeh et al. |
| 8,836,141 B2 | 9/2014 | Chi et al. |
| 2003/0089928 A1* | 5/2003 | Saito ................. H01L 21/28562 |
| | | 257/213 |
| 2005/0083765 A1 | 4/2005 | Jeong |
| 2005/0124095 A1 | 6/2005 | Liaw |
| 2005/0286285 A1* | 12/2005 | Lee ....................... G11C 5/063 |
| | | 365/63 |
| 2009/0244950 A1 | 10/2009 | Nii |
| 2013/0182497 A1 | 7/2013 | Wada |
| 2014/0015061 A1* | 1/2014 | Pelley ...................... G11C 7/18 |
| | | 257/369 |
| 2014/0215420 A1 | 7/2014 | Lin et al. |
| 2014/0264924 A1 | 9/2014 | Yu et al. |
| 2014/0282289 A1 | 9/2014 | Hsu et al. |
| 2014/0325466 A1 | 10/2014 | Ke et al. |
| 2016/0268343 A1* | 9/2016 | Sugimae ............. H01L 45/1233 |

\* cited by examiner

| 102 | WL Decoder 104 | 102 |
|---|---|---|
| LIOs 112 | LCTRL 110 | LIOs 112 |
| 102 | WL Decoder 104 | 102 |
| 102 | WL Decoder 104 | 102 |
| LIOs 112 | LCTRL 110 | LIOs 112 |
| 102 | WL Decoder 104 | 102 |
| IOs 108 | CTRL 106 | IOs 108 |

*Fig. 1A*

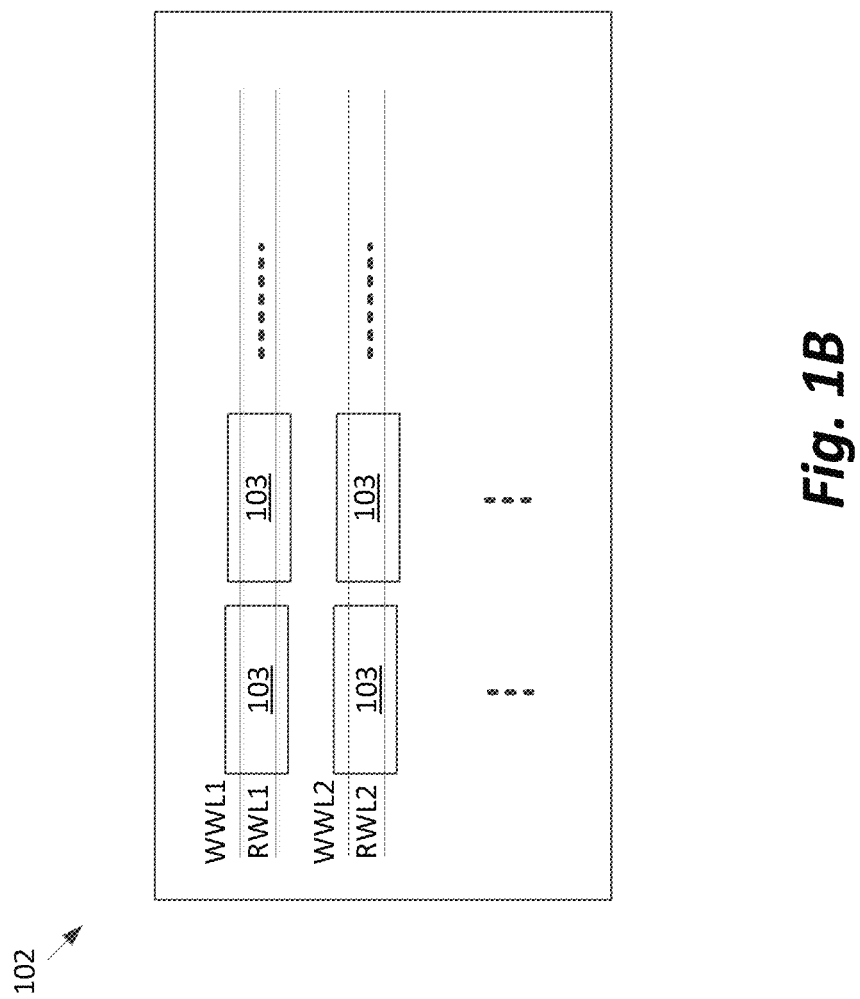

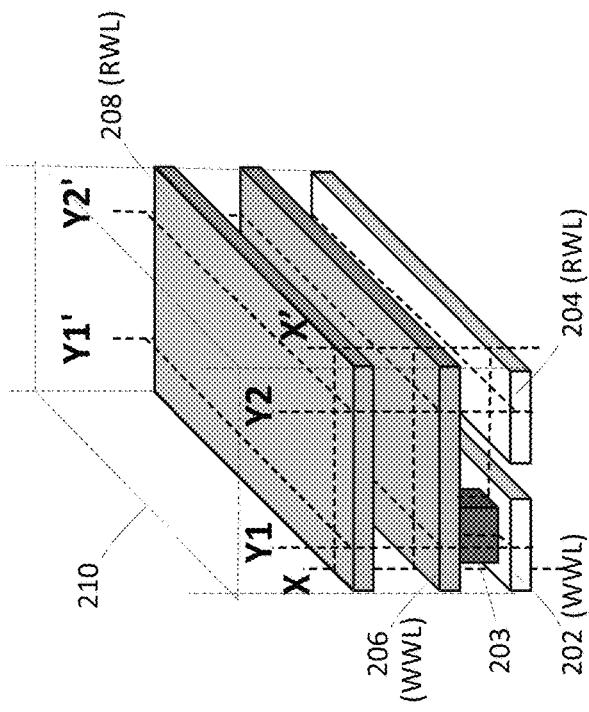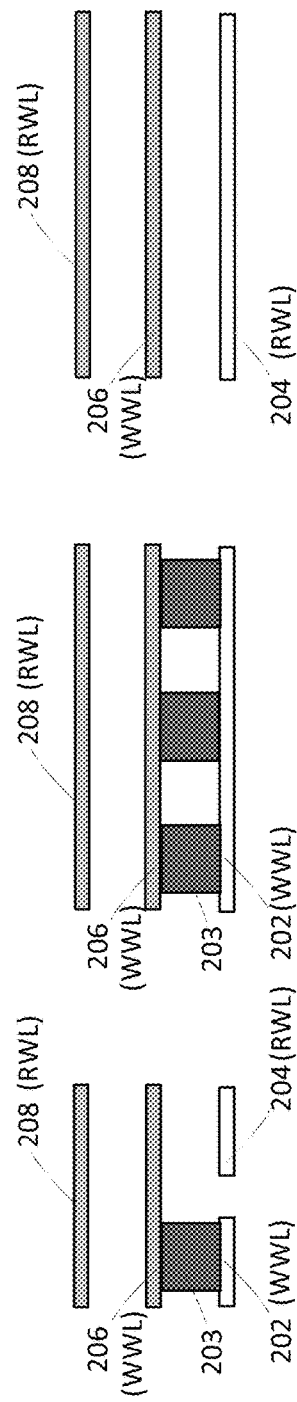

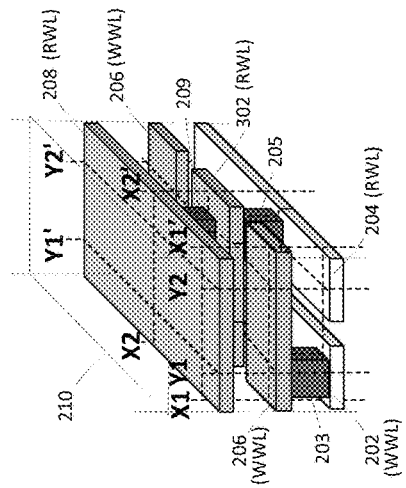
Fig. 3A
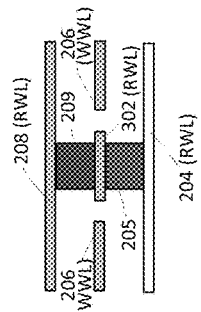
Fig. 3E
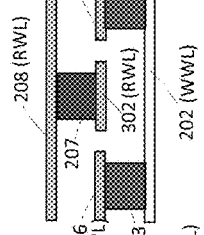
Fig. 3D
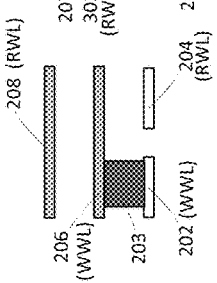
Fig. 3C
Fig. 3B

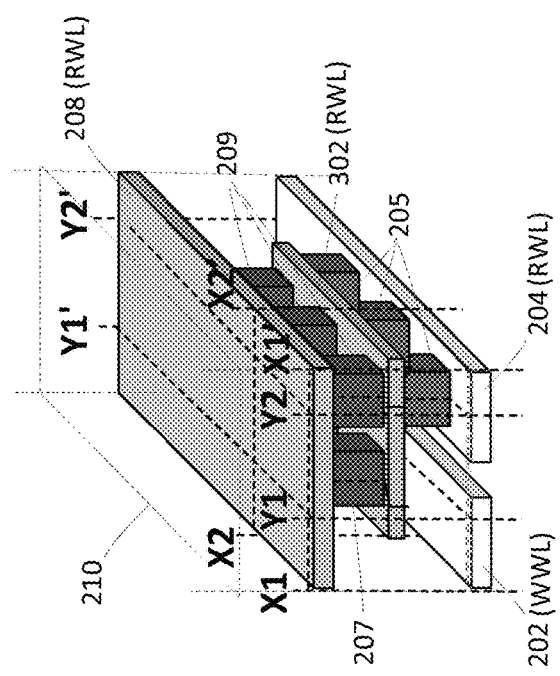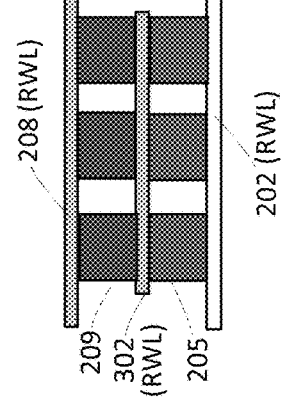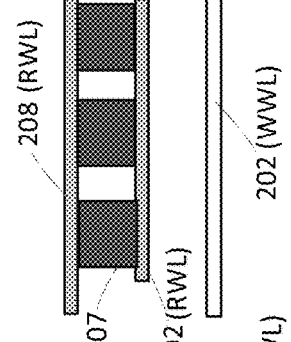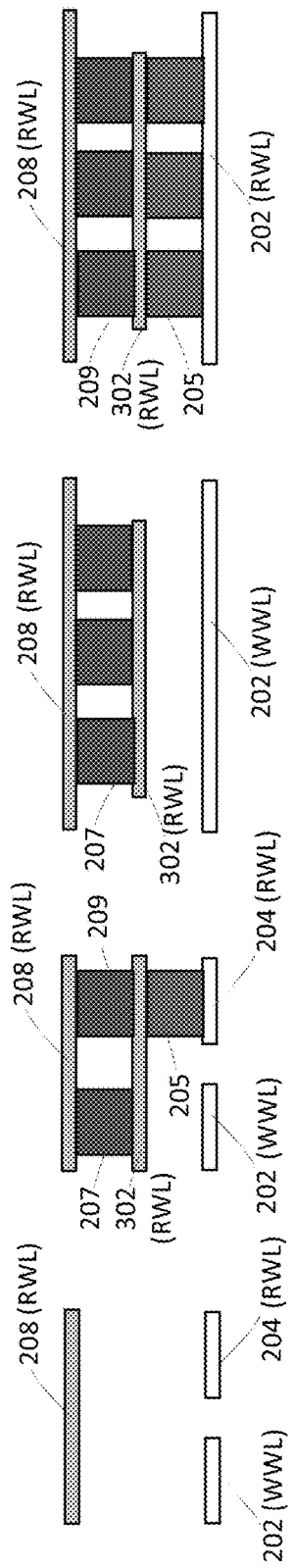

MEMORY METAL SCHEME

PRIORITY CLAIM

The present application is a divisional of U.S. application Ser. No. 14/600,666, filed Jan. 20, 2015, which is incorporated herein by reference in its entirety.

BACKGROUND

The semiconductor integrated circuit (IC) industry has experienced rapid growth. Technological advances in IC materials and design have produced generations of ICs where each generation has smaller and more complex circuits than the previous generation. In the course of integrated circuit evolution, functional density (i.e., the number of interconnected devices per chip area) has generally increased while geometry size (i.e., the smallest component or line that can be created using a fabrication process) has decreased.

Semiconductor memory devices are also continually shrinking in size while at the same time increasing in density or volume and operating at a lower power. The operations of memory devices are synchronized with various control signals and data signals. As the signal paths for signals shrink in size, the resistance of the signal paths increases. An increase in signal path resistance results in various problems, such as causing a speed bottleneck in the memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a schematic diagram of an exemplary memory layout in accordance with some embodiments.

FIG. 1B is a schematic diagram of an exemplary memory array in accordance with some embodiments.

FIG. 2A is a perspective diagram of an exemplary metal scheme of a first layout section (Cell A) of control signals in a memory in accordance with some embodiments.

FIGS. 2B-2D are cross section views of the exemplary metal scheme in FIG. 2A in accordance with some embodiments.

FIG. 3A is a perspective diagram of an exemplary metal scheme of a second layout section (Cell B) of control signals in a memory in accordance with some embodiments.

FIGS. 3B-3E are cross section views of the exemplary metal scheme in FIG. 3A in accordance with some embodiments.

FIG. 4A is a perspective diagram of another exemplary metal scheme of the second layout section (Cell B') of control signals in a memory in accordance with some embodiments.

FIGS. 4B-4E are cross section views of the exemplary metal scheme in FIG. 4A in accordance with some embodiments.

DETAILED DESCRIPTION

Figure 5A:
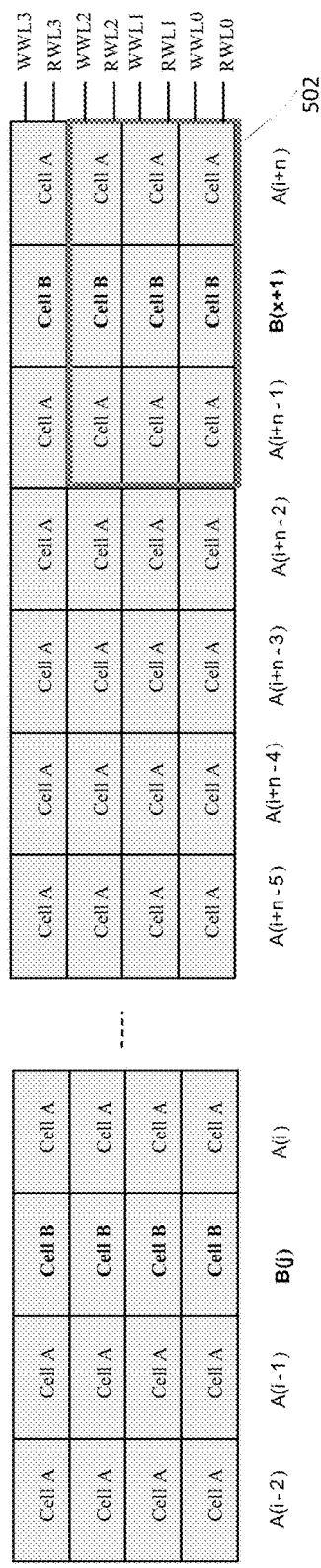
FIG. 5A is an exemplary diagram of layout sections of control signals (Cell A and Cell B) in a memory array in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor memory devices are continually shrinking in size while at the same time increasing in density or volume and operating at a lower power. The memory device may include multiple memory arrays. Memory arrays include multiple memory cells arranged in rows and columns. The operations of memory devices are synchronized with various control signals and data signals. For example, a word line controls access to the memory cell. Data signals transfer data for the read/write operation of the memory cell. As the signal paths for signals shrink in size, the resistance of the signal paths increases. An increase in signal path resistance results in various problems, including a speed bottleneck in the memory.

Some integrated circuit-based register files are implemented with static random access memory (SRAM) with multiple ports. SRAM is a type of volatile semiconductor memory that stores data bits using bi-stable circuitry. Bi-stable circuitry will maintain the integrity of a stored bit without refreshing. A single SRAM cell is referred to as a memory cell because the single SRAM cell stores one bit of information, represented by a logic state of two cross coupled inverters. Embedded SRAM is used in high speed communication, image processing and system-on-chip (SOC) applications.

In advance technology nodes with a relatively smaller critical dimension, some two port register files or dual port SRAM memory has a memory cell with a layout that is relatively long and thin in one direction. In some SRAM memories, control signal paths (lines) such as word lines (WL) implemented with metal lines in the same direction have a limited layout width to work with. Such control lines may have an increased resistance due to relatively narrow line width. For example, the signal paths for word lines of some advanced technology node have 2.5 times larger resistance than a previous technology node due to the narrower line width. In such a situation, the word line resistance becomes the speed bottleneck of the memory operation. Some memory uses word line repeaters to regenerate the word line signals after a specified word line length to overcome increased resistance of the word line. Using such word line repeaters will increase the total memory layout area and power consumption.

In the present disclosure, control lines of a memory are implemented using multiple metal layers in the control line layout area to reduce the control line resistance without incurring layout area penalty. By reducing the control line resistance, the operation speed of the memory is improved. The multiple metal layers are already used in other part of the memory, thus no extra metal layers are added in some embodiments.

FIG. 1A is a schematic diagram of an exemplary memory layout (floor plan) 100 in accordance with some embodiments. The memory layout 100 includes memory arrays 102, word line decoders 104, control circuit 106, input/outputs (IOs) 108, local control circuits 110, and local input/outputs (LIOs) 112. The memory arrays 102 are distributed in multiple memory areas and include memory cells. IOs 108 provide input and output signal connections, such as data input/output signals, memory address signals for read/write operations, etc. The control circuit 106 provides the overall memory control including read/write operations, power on/off function, etc. LIOs 112 connected to the IOs 108 provide local input and output signal connections for the local memory arrays 102. Local control circuit 110 is connected to the control circuit 106 and provides local control of the memory arrays 102. The word line decoders 104 provide word line address selection information to enable desired word lines for read/write operations of memory cells in the memory arrays 102.

FIG. 1B is a schematic diagram of an exemplary memory array 102 in accordance with some embodiments. The memory array 102 includes memory cells 103 arranged in rows and columns. In some embodiments, multiple control lines such as a write word line (WWL) and a read word line (RWL) are disposed over each row of the memory cells 103. For example, a write word line WWL1 for row 1 and a read word line RWL1 for row 1 are disposed over the first row of memory cells 103, and a write word line WWL2 for row 2 and a read word line RWL2 for row 2 are disposed over the first row of memory cells 103 in FIG. 1B. The WWLs and RWLs are arranged in the same direction, i.e., in the row direction in FIG. 1B.

In some embodiments, the memory cell 103 has a longer horizontal dimension (row direction) than the vertical dimension (column direction) in the memory layout. This limits the line width available for each control line that pass over the memory cell 103 area in the row direction. Multiple control lines such as WWL and RWL are implemented with metal lines in the same direction in a limited layout area over the memory cells 103 in some embodiments. The multiple metal lines sharing the layout area are used as described below to implement such control lines in order to reduce resistance and to improve the memory operation speed without incurring area penalty.

In some embodiments, the metal scheme of control signals such as WWL and RWL includes two layout sections (Cell A and Cell B). One layout section (Cell A) is described below with respect to FIGS. 2A-2D. Another layout section (Cell B) is described with respect to FIGS. 3A-3E and 4A-4E. A combined layout section diagram is described with respect to FIGS. 5A-5C.

FIG. 2A is a perspective diagram of an exemplary metal scheme of a first layout section (Cell A) of control signals in a memory in accordance with some embodiments. The exemplary control signals for the metal scheme in FIG. 2A are a write word line (WWL) and a read word line (RWL) of the memory. In other embodiments, other control lines such as y-decode lines for word line decoding or any other suitable control lines are capable of being implemented using the metal scheme in FIG. 2A.

The WWL and RWL are disposed over the memory cells 103 as shown in FIG. 1B (not shown in FIG. 2A for simplicity). In some embodiments, the first metal layer M1 is used for wiring devices and bit lines of the memory. M1 refers to the first metal layer over the substrate in integrated circuits in some embodiments. And the second metal layer M2, the third metal layer M3, and the fourth metal layer M4 are used for the metal scheme in FIG. 2A in some embodiments. M2 is the metal layer above M1 in integrated circuits; M3 is the metal layer above M2 in integrated circuits; M4 is the metal layer above M3 in integrated circuits, and so on. In other embodiments, other combinations of metal layers are capable of being used for the metal scheme in FIG. 2A. For example, (M1, M2, and M3), or (M3, M4, and M5), are capable of being used for the metal scheme in FIG. 2A.

In cell A (the layout section in FIG. 2A), WWL includes M2 (202) and M3 (206) in some embodiments. RWL includes M2 (204) and M4 (208) in some embodiments. WWL is electrically isolated from RWL by surrounding dielectric material (not shown) in between metal lines and vias. WWL and RWL extend in the same direction and share a control line layout area 210. At least one via 203 connects WWL in M2 (202) and WWL in M3 (206). The more vias 203 are used, the lower resistance the connected control line WWL will have. The RWL in M2 (204) and RWL in M4 (208) are connected in a different layout section (Cell B) as shown in FIG. 3A in some embodiments.

In some embodiments, M2 in the control line layout area 210 is divided into WWL (202) and RWL (204). In some embodiments, M3 and M4 are not allowed to be divided into two lines due to process limitations. In some embodiments, M3 optionally has a different (e.g., perpendicular) favored direction from M2 that is divided into two lines. Also, in advanced technology nodes with a smaller critical dimension, an advanced lithography technique such as double patterning (for higher resolution) is optionally applied to limited metal layers such as M1, M2, and M3, but not M4 or higher in some embodiments. Due to such process limitations, control lines in M3 and M4 are not divided in a similar way as M2 for WWL and RWL. Instead, WWL includes M3 (206), and RWL includes M4 (208) in some embodiments. In other embodiments, the metal layer assignments of control lines, e.g., WWL and RWL, are exchanged or different.

Metal features, such as the metal layers M1, M2, M3, M4, etc. and vias 203 comprise one or more of copper, copper alloys, aluminum, aluminum alloys, tin, nickel, gold, silver, or any other electrically conductive material. In some embodiments, the metal features are formed using damascene processes. The damascene process includes depositing a dielectric layer, etching the dielectric layer to form openings or trenches using lithography processes, filling the openings or trenches with metallic materials, and performing a chemical mechanical polish to remove excess material.

In some embodiments, the openings or trenches are filled with a barrier layer and a conductive material, using a suitable process, e.g., electrolytic plating, electroless plating process, physical vapor deposition (PVD) such as sputtering, chemical vapor deposition (CVD), plasma enhanced CVD (PECVD), metal organic chemical vapor deposition (MOCVD), or any other suitable process. In some embodiments, the barrier layer, such as Ta, TaN, TiN, or any combination thereof, is formed on the trench and the via opening before filling in the trench and the via opening with the conductive material. The barrier layer is deposited by a proper technique, such as atomic layer deposition (ALD), PVD, or CVD. In some embodiments, the barrier layer acts as a diffusion barrier and adhesive layer for integrity of the metal features.

In some embodiments, a Cu seed layer is formed by PVD with a thickness ranging from about 2 nm to about 10 nm in the metal trench and the via opening prior to filling the metal trench and the via opening. In some embodiments, a planarizing process such as a chemical mechanical polishing is performed after filling the metal trench and the via opening to remove excess conductive materials (e.g., a top part of the metal filled over the metal trenches).

In some fabrication processes, a dual damascene process is used to form metal lines and vias. In a dual-damascene structure, a single metal deposition step is used to simultaneously form main metal lines in the trenches and the metal in the vias. Thus, both the trenches and vias are capable of being formed in a single dielectric layer. In some embodiments, the vias and trenches for metal lines are defined by using two lithography steps. In some embodiments, trenches are etched to a depth of 4000-5000 Å, and the vias are etched to a depth of 5000-7000 Å. After the via and trench recesses are etched, the via is filled in the same metal-deposition step that fills the trench. After filling the vias and trenches, the excess metal deposited outside the trench is removed by a chemical mechanical planarization (CMP) process.

In some embodiments, the dielectric layer in between metal layers comprises one or more of a low-k dielectric material, $SiO_2$, or other dielectric material. In some embodiments, each of the dielectric layer has a thickness ranging from about 30 nm to about 100 nm. In some embodiments, low-k dielectric material (dielectric) has a dielectric constant less than about 3.5. In some embodiments, low-k dielectrics includes a class of dielectrics referred to as extremely low-k (ELK) dielectrics, which have a dielectric constant less than about 2.5. For example, the extremely low-k dielectrics are capable of being used as interlayer dielectrics (ILDs) for sub-micron technology (e.g., for 65 nm node, 45 nm node, or beyond technology). In some embodiments, the extremely low-k dielectrics are porous. In some embodiments, low-k dielectrics include oxygen, silicon, nitrogen, and the like. The exemplary ELK materials include carbon-containing materials, organo-silicate glass, porogen-containing materials, and the like. In some embodiments, the dielectric layers including low-k dielectrics are deposited using spin-on or a CVD method such as Plasma Enhanced CVD (PECVD), Low Pressure CVD (LPCVD), or Atomic Layer CVD (AL-CVD).

FIGS. 2B-2D are cross section views of the exemplary metal scheme in FIG. 2A in accordance with some embodiments. FIG. 2B is a cross section view of the metal scheme in FIG. 2A along the cut line X-X'. FIG. 2C is a cross section view of the metal scheme in FIG. 2A along the cut line Y1-Y1'. FIG. 2D is a cross section view of the metal scheme in FIG. 2A along the cut line Y2-Y2'. One control line WWL is implemented in M2 (202) and M3 (206), while the other control line RWL is implemented in M2 (204) and M4 (208). At least one via 203 connects WWL in M2 (202) and M3 (206). RWL in M2 (204) and M4 (208) are not connected in this layout section (Cell A), but instead connected in another layout section (Cell B) in FIG. 3A in some embodiments.

FIG. 3A is a perspective diagram of an exemplary metal scheme of a second layout section (Cell B) of control signals in a memory in accordance with some embodiments. The exemplary control signals for the metal scheme in FIG. 3A are a write word line (WWL) and a read word line (RWL) of the memory. In other embodiments, other control lines such as y-decode lines for word line decoding or any other suitable control lines are implemented using the metal scheme in FIG. 3A.

The WWL and RWL are disposed over the memory cells 103 as shown in FIG. 1B (not shown in FIG. 3A for simplicity). In some embodiments, the second metal layer M2, the third metal layer M3, and the fourth metal layer M4 are used for the metal scheme in FIG. 3A. In other embodiments, other combinations of metal layers are capable of being used for the metal scheme in FIG. 3A. For example, (M1, M2, and M3), or (M3, M4, and M5), are capable of being used for the metal scheme in FIG. 3A.

In cell B (the layout section) in FIG. 3A, WWL includes M2 (202) and M3 (206) in some embodiments. RWL includes M2 (204), M3 (302), and M4 (208) in some embodiments. WWL in M3 (206) and RWL in M3 (302) are not connected and WWL is electrically isolated from RWL by surrounding dielectric material (not shown) in between metal lines and vias. WWL and RWL extend in the same direction and share the control line layout area 210 in some embodiments. At least one via 203 connects WWL in M2 (202) and WWL in M3 (206). The RWL in M2 (204), in M3 (302), and in M4 (208) are connected through vias 205, 207, and 209 as shown in FIGS. 3A-3E in some embodiments. The more vias, such as 203, 205, and 207, are used, the lower resistance the connected control lines such as WWL and RWL will have.

In some embodiments, M2 in the control line layout area 210 is divided into WWL (202) and RWL (204). In some embodiments, M3 in the control line layout area 210 is divided into WWL (206) and RWL (302). The direction of division in M2 is different (e.g., perpendicular) to the direction of division in M3 in some embodiments. The RWL in M3 (302) is connected to the RWL in M2 (204) through vias 205. The RWL in M3 (302) is connected to the RWL in M4 (208) through vias 207 and 209. In other embodiments, the metal layer assignments of control lines, e.g., WWL and RWL, are exchanged or different.

FIGS. 3B-3D are cross section views of the exemplary metal scheme in FIG. 3A in accordance with some embodiments. FIG. 3B is a cross section view of the metal scheme in FIG. 3A along the cut line X1-X1'. FIG. 3C is a cross section view of the metal scheme in FIG. 3A along the cut line X2-X2'. FIG. 3D is a cross section view of the metal scheme in FIG. 3A along the cut line Y1-Y1'. FIG. 3E is a cross section view of the metal scheme in FIG. 3A along the cut line Y2-Y2'. One control line WWL is implemented in M2 (202) and M3 (206), while the other control line RWL is implemented in M2 (204), M3 (302), and M4 (208). At least one via 203 connects WWL in M2 (202) and M3 (206). RWL in M2 (204), M3 (302), and M4 (208) are connected in this layout section (Cell B) through vias 205, 207, and 209.

FIG. 4A is a perspective diagram of another exemplary metal scheme of the second layout section (Cell B') of control signals in a memory in accordance with some embodiments. The exemplary control signals for the metal scheme in FIG. 4A are a write word line (WWL) and a read word line (RWL) of the memory. In other embodiments, other control lines such as y-decode lines for word line decoding or any other suitable control lines are implemented using the metal scheme in FIG. 4A.

The WWL and RWL are disposed over the memory cells 103 as shown in FIG. 1B (not shown in FIG. 4A for simplicity). In some embodiments, the second metal layer M2, the third metal layer M3, and the fourth metal layer M4 are used for the metal scheme in FIG. 4A. In other embodiments, other combinations of metal layers are capable of being used for the metal scheme in FIG. 4A. For example, (M1, M2, and M3) or (M3, M4, and M5) are capable of being used for the metal scheme in FIG. 4A.

In Cell B' (the layout section) in FIG. 4A, WWL includes M2 (202) in some embodiments. RWL includes M2 (204), M3 (302), and M4 (208) in some embodiments. WWL is electrically isolated from RWL by surrounding dielectric material in between metal lines and vias. WWL and RWL extend in the same direction and share the control line layout area 210 in some embodiments. The RWL in M2 (204), in M3 (302), and in M4 (208) are connected through vias 205, 207, and 209 as shown in FIGS. 4A-4E in some embodiments.

In some embodiments, M2 in the control line layout area 210 is divided into WWL (202) and RWL (204). The RWL in M3 (302) is connected to the RWL in M2 (204) through vias 205. The RWL in M3 (302) is connected to the RWL in M4 (208) through vias 207 and 209. In other embodiments, the metal layer assignments of control lines, e.g., WWL and RWL, are exchanged or different.

FIGS. 4B-4D are cross section views of the exemplary metal scheme in FIG. 4A in accordance with some embodiments. FIG. 4B is a cross section view of the metal scheme in FIG. 4A along the cut line X1-X1'. FIG. 4C is a cross section view of the metal scheme in FIG. 4A along the cut line X2-X2'. FIG. 4D is a cross section view of the metal scheme in FIG. 4A along the cut line Y1-Y1'. FIG. 4E is a cross section view of the metal scheme in FIG. 4A along the cut line Y2-Y2'. One control line WWL is implemented in M2 (202), while the other control line RWL is implemented in M2 (204), M3 (302), and M4 (208). RWL in M2 (204) and M3 (302) are connected in this layout section (Cell B') through vias 205. RWL in M3 (302) and M4 (208) are connected in this layout section (Cell B') through vias 207 and 209.

FIG. 5A is an exemplary diagram of layout sections of control signals (Cell A and Cell B) in a memory array 102 in accordance with some embodiments. Cell B in FIG. 5A represents either Cell B in FIGS. 3A-3E, or Cell B' in FIGS. 4A-4E. In some embodiments, the size of each layout section (Cell A or Cell B) is about the same size of the layout of each memory cell 103 and each layout section (Cell A or Cell B) is disposed over each memory cell 103 in FIG. 1B. In other embodiments, the size of each layout section (Cell A or Cell B) is different from the size of each memory cell 103 and/or each layout section (Cell A or Cell B) is disposed over a portion or more than one layout area of each memory cell 103 in FIG. 1B.

Each column of layout sections has the same layout sections (Cell A or Cell B) arranged in the column in FIG. 5A. In other embodiments, each column of layout sections has a different arrangement of layout sections (combination of Cell A and Cell B). Even though four rows of layout sections are shown in FIG. 5A, any number of rows of layout sections is possible in other embodiments.

Each row of layout sections are connected to control lines RWL and WWL. For example, RWL0 and WWL0, RWL1 and WWL1, RWL2 and WWL2, etc. In each row of layout sections, one Cell B is inserted after placing a quantity of n Cell A's (where n is a positive integer number) and Cell B provides electrical connections between M2 and M4 as shown in FIGS. 3A-3E or 4A-4E. If n becomes large, there will be a larger number of Cell A's that provide electrical connections between M2 and M3 of WWL, and a relatively smaller number of Cell B's that provide connection between M2 and M4 of RWL in a given number of layout sections. With more electrical connections between metal layers, the resistance becomes smaller. And with less electrical connections between metal layers, the resistance becomes larger. Thus, the WWL resistance will become relatively smaller and the RWL resistance will become relatively larger. If n becomes smaller, there will be a relatively smaller number of Cell A's that provide connection between M2 and M3 of WWL, and a relatively larger number of Cell B's that provide connection between M2 and M4 of RWL. Thus, the WWL resistance will be relatively larger and the RWL resistance will be relatively smaller.

Figure 5B:
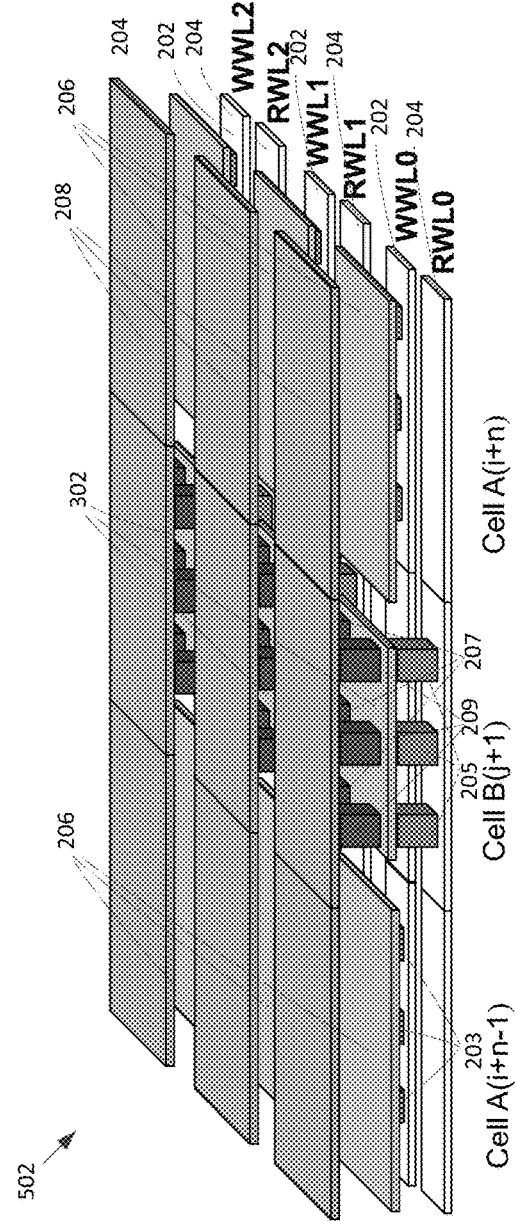
FIG. 5B is a perspective diagram of some layout sections of control signals in FIG. 5A in accordance with some embodiments.

FIG. 5B is a perspective diagram of layout sections 502 of control signals in FIG. 5A in accordance with some embodiments. Cell B' in FIGS. 4A-4E are used for Cell B layout sections in FIG. 5B.

In Cell A(i+n−1) and Cell A (i+n), one control line WWL is implemented in M2 (202) and M3 (206), while the other control line RWL is implemented in M2 (204) and M4 (208). At least one via 203 connects WWL in M2 (202) and M3 (206). RWL in M2 (204) and M4 (208) are not connected in Cell A(i+n−1) and Cell A (i+n), but instead connected in Cell B(j+1).

In Cell B(j+1), the control line WWL is implemented in M2 (202), while the other control line RWL is implemented in M2 (204), M3 (302), and M4 (208). RWL in M2 (204) and M3 (302) are connected in Cell B(j+1) through vias 205. RWL in M3 (302) and M4 (208) are connected in this layout section (Cell B') through vias 207 and 209.

By combining multiple metal lines (e.g., M2, M3, and/or M4) for each control lines (e.g., WWL and RWL), the resistance value of the control lines is reduced to improve the memory operation speed. Since the control lines share the layout area (e.g, 210 in FIG. 2A), there is no area penalty. In some examples, the resistance of control lines WWL and RWL is reduced and the operation speed is improved by 2.5 times for the memory using the metal schemes in FIGS. 2A-4E, compared to a memory not using the metal schemes in FIGS. 2A-4E.

Figure 5C:
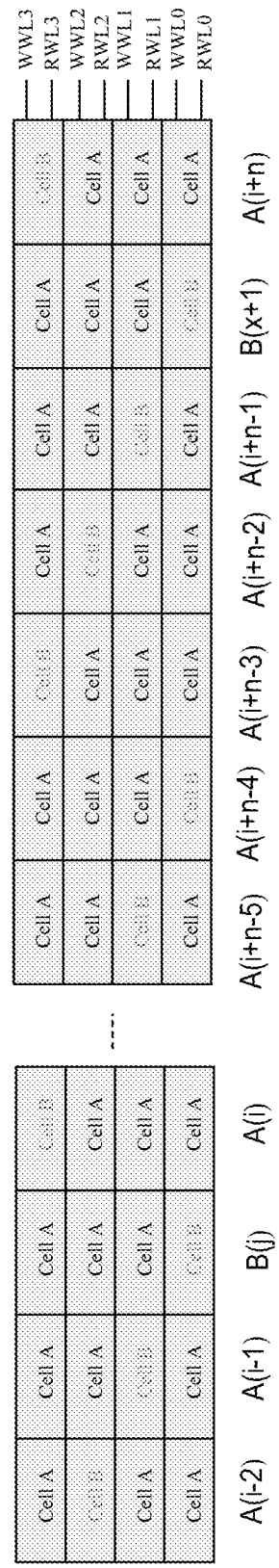
FIG. 5C is another exemplary diagram of layout sections of control signals in a memory in accordance with some embodiments.

FIG. 5C is another exemplary diagram of layout sections of control signals in a memory in accordance with some embodiments. Compared to FIG. 5A where each column has the same layout sections (Cell A or Cell B), each column in FIG. 5C has a mix of layout sections (Cell A and Cell B). Cell B is arranged in a diagonal pattern across adjacent columns in the layout diagram in FIG. 5C, but Cell B is capable of being arranged in any other pattern different from FIG. 5C in other embodiments.

Figure 6:
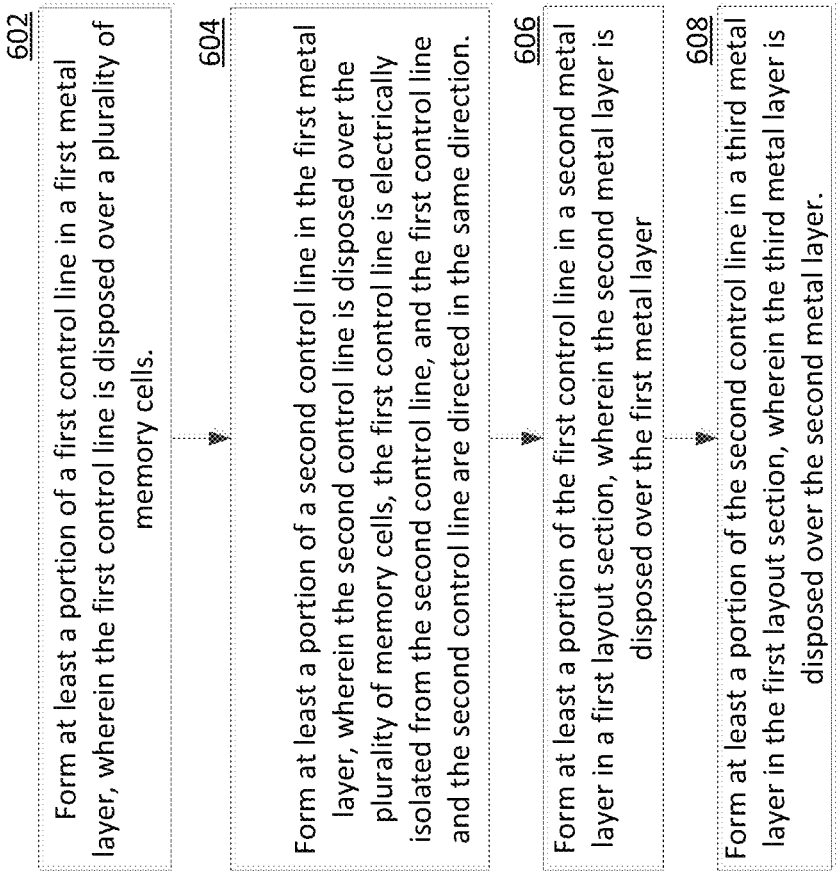
FIG. 6 is an exemplary flow diagram of fabrication method of a memory in accordance with some embodiments.

FIG. 6 is an exemplary flow diagram of fabrication method of a memory in accordance with some embodiments. In operation 602, at least a portion of a first control line such as WWL or RWL, is formed in a first metal layer, such as M2. The first control line is disposed over a plurality of memory cells, such as 103.

In operation 604, at least a portion of a second control line such as RWL or WWL is formed in the first metal layer, such as M2. The second control line is disposed over the plurality of memory cells, such as 103. The first control line is electrically isolated from the second control line, and the first control line and the second control line extend in the same direction. The first control line in the first metal layer and the second control line in the first metal layer are parallel in some embodiments.

In operation 606, at least a portion of the first control line is formed in a second metal layer, such as M3, in a first layout section, such as Cell A. The second metal layer is disposed over the first metal layer.

In operation 608, at least a portion of the second control line is formed in a third metal layer, such as M4, in the first layout section. The third metal layer is disposed over the second metal layer.

In some embodiments, at least one via is formed in the first layout section to connect the first control line in the first metal layer and the first control line in the second metal layer.

In some embodiments, at least a portion of the first control line is formed in the second metal layer in a second layout section, such as Cell B or Cell B'. At least a portion of the second control line is formed in the second metal layer and the third metal layer in the second layout section.

In some embodiments, at least one via is formed in the second layout section to connect the second control line in the second metal layer and the second control line in the third metal layer.

One aspect of this description relates to a method of fabricating a memory. The method includes forming a first portion of a first line in a first metal layer, forming a first portion of a second line in the first metal layer, forming a second portion of the first line in a second metal layer, and forming a second portion of the second line in a third metal layer. The first line is over a plurality of memory cells. The second line is over the plurality of memory cells, the first line is electrically isolated from the second line, and the first line and the second line extend in a same direction. The second metal layer is over the first metal layer. The third metal layer is over the second metal layer and the third metal layer is electrically isolated from the first line.

Another aspect of this description relates to a method of fabricating a memory. The method includes forming a first portion of a first control line and a first portion of a second control line in a first metal layer, forming a second portion of the first line in a second metal layer over the first metal layer, and forming a second portion of the second line in a third metal layer over the second metal layer. The first control line is isolated from the second control line. The second portion of the first line is coupled to the first portion of the first control line. The third metal layer substantially overlaps the second metal layer.

Still another aspect of this description relates to a method of fabricating a memory array. The method includes designing a plurality of first layout sections in a row direction, and inserting a second layout section into every N-th first layout section. Each of the first layout section of the plurality of first layout sections includes a first control line and a second control line in a first metal layer, a lower conductive line in a second metal layer coupled to the first control line in the first metal layer, and an upper conductive line in a third metal layer coupled to the second control line in the first metal layer. The first control line is isolated from the second control line. N is a positive integer equal to or greater than 2. The second layout section includes the first control line and the second control line in the first metal, a lower conductive line in the second metal layer coupled to the first control line in the first metal layer, and an upper conductive line in the third metal layer coupled to the second control line in the second metal layer. The lower conductive line in the first layout section is isolated from the lower conductive line in the second layout section, The second control line couples the upper conductive line in the first layout section and the upper conductive line in the second layout section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a memory, the method comprising:
    forming a first portion of a first line in a first metal layer, wherein the first line is over a plurality of memory cells;
    forming a first portion of a second line in the first metal layer, wherein the second line is over the plurality of memory cells, the first line is electrically isolated from the second line, and the first line and the second line extend in a same direction;
    forming a second portion of the first line in a second metal layer, wherein the second metal layer is over the first metal layer; and
    forming a second portion of the second line in a third metal layer, wherein the third metal layer is over the second metal layer and the third metal layer is electrically isolated from the first line.

2. The method of claim 1, wherein forming the second portion of the second line in the third metal layer comprises aligning a boundary of the third metal layer to a boundary of the second metal layer.

3. The method of claim 1, wherein forming the first portion of the first line in the first metal layer comprises extending both ends of the first portion of the first line in a first direction to align with ends of the third metal layer.

4. The method of claim 1, wherein the first line in the first metal layer is formed parallel to the second line in the first metal layer.

5. The method of claim 1, further comprising:
    forming at least one via coupling to the first line in the first metal layer and the first line in the second metal layer.

6. The method of claim 1, further comprising:
    forming a third portion of the first line in the second metal layer; and
    forming a third portion of the second line in the second metal layer, wherein the third portion of the second line is between the second portion of the first line and the third portion of the first line.

7. The method of claim 6, further comprising:
    forming at least one via coupling to the third portion of the second line and a fourth portion of the second line in the third metal layer.

8. The method of claim 6, wherein the third portion of the first line in the second metal layer is formed to extend in a direction perpendicular to the first portion of the first line in the first metal layer.

9. A method of fabricating a memory, the method comprising:
forming a first portion of a first control line and a first portion of a second control line in a first metal layer, wherein
the first control line and the second control line are formed over a plurality of memory cells, and
the first control line is isolated from the second control line;
forming a second portion of the first control line in a second metal layer over the first metal layer, the second portion of the first control line coupled to the first portion of the first control line; and
forming a second portion of the second control line in a third metal layer over the second metal layer, wherein the third metal layer substantially overlaps the second metal layer.

10. The method of claim 9, wherein the first control line is formed to be a write word line and the second control line is formed to be a read word line and the first control line is formed parallel to the second control line.

11. The method of claim 9, wherein ends of the first portion of the first control line, ends of the second portion of the first control line, ends of the first portion of the second control line and ends of the second portion of the second control line are formed to be aligned with each other.

12. The method of claim 9, wherein the second portion of the first control line is formed to substantially overlap the first portion of the first control line and the first portion of the second control line.

13. The method of claim 9, further comprising:
forming a third portion of the first control line in the second metal layer and a third portion of the second control line in the second metal layer; and
forming a fourth portion of the second control line in the third metal layer.

14. The method of claim 13, wherein forming the third portion of the first control line comprises forming the third portion of the first control line isolated from the third portion of the second control line, wherein the second portion of the first control line extends perpendicularly to the first portion of the first control line.

15. The method of claim 9, further comprising:
forming a third portion of the second control line in the second metal layer, wherein the third portion of the second control line is isolated from the second portion of the first control line; and
forming a fourth portion of the second control line in the third metal layer.

16. The method of claim 15, wherein an area of the third portion of the second control line is formed smaller than an area of the fourth portion of the second control line, and a boundary of the fourth portion of the second control line extends beyond a boundary of the third portion of the second control line.

17. A method of fabricating a memory array, the method comprising:
forming, in a first metal layer, a first control line and a second control line over a plurality of memory cells extending in a row direction, wherein the first control line is isolated from the second control line;
forming, in a second metal layer, a first portion of a lower conductive line coupled to the first control line in the first metal layer;
forming, in the second metal layer, a second portion of the lower conductive line coupled to the second control line in the first metal layer; and
forming, in a third metal layer, a higher conductive line coupled to the second control line in the first metal layer and the second portion of the lower conductive line in the second metal layer.

18. The method of claim 17, wherein the first control line is formed to be a write word line and the second control line is formed to be a read word line.

19. The method of claim 17, wherein the first control line, the second control line, and the higher conductive line are coupled to extend in the row direction.

20. The method of claim 17, wherein the higher conductive line in the third metal layer is formed to overlap the first portion and the second portion of the lower conductive line in the second metal layer and the first control line and the second control line in the first metal layer.

* * * * *